United States Patent
Assefa et al.

(10) Patent No.: US 8,884,387 B2
(45) Date of Patent: Nov. 11, 2014

(54) PILLAR-BASED INTERCONNECTS FOR MAGNETORESISTIVE RANDOM ACCESS MEMORY

(75) Inventors: Solomon Assefa, Ossining, NY (US); Michael C. Gaidis, Wappingers Falls, NY (US); Eric A. Joseph, White Plains, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 13/568,670

(22) Filed: Aug. 7, 2012

(65) Prior Publication Data

US 2012/0299136 A1  Nov. 29, 2012

Related U.S. Application Data

(62) Division of application No. 12/549,799, filed on Aug. 28, 2009, now Pat. No. 8,796,041.

(51) Int. Cl.
| | | |
|---|---|---|
| H01L 29/82 | (2006.01) | |
| H01L 27/22 | (2006.01) | |
| H01L 43/12 | (2006.01) | |
| H01L 43/08 | (2006.01) | |

(52) U.S. Cl.
CPC .............. *H01L 43/12* (2013.01); *H01L 27/222* (2013.01); *H01L 43/08* (2013.01)
USPC .................................. 257/421; 257/E29.323

(58) Field of Classification Search
CPC ..... H01L 43/12; H01L 27/222; H01L 27/228; H01L 21/7684; H01L 21/76807; H01L 43/08; H01L 21/76885; H01L 21/76852; H01L 21/76849
USPC ................................ 438/3; 257/421, E29.323
See application file for complete search history.

(56) References Cited

U.S. PATENT DOCUMENTS

| | | | |
|---|---|---|---|
| 6,143,662 A | 11/2000 | Rhoades et al. | |
| 6,174,737 B1 | 1/2001 | Durlam et al. | ..................... 438/3 |
| 6,350,695 B1 | 2/2002 | Tae et al. | |
| 7,151,051 B2 | 12/2006 | He et al. | |
| 7,287,325 B2 | 10/2007 | Chanda et al. | |
| 7,358,100 B2 | 4/2008 | Cao et al. | |

(Continued)

FOREIGN PATENT DOCUMENTS

CA          2082771          5/1994

OTHER PUBLICATIONS

Buchanan, Keith, "The Evolution of Interconnect Technology for Silicon Integrated Circuitry," Copyright 2002, GaAsMANTECH,Inc., 2002 GaAsMANTECH Conference.

*Primary Examiner* — Duy T Nguyen
(74) *Attorney, Agent, or Firm* — Thomas Grzesik; Fleit Gibbons Gutman Bongini & Bianco PL

(57) ABSTRACT

A semiconductor device includes a substrate including an M2 patterned area. A VA pillar structure is formed over the M2 patterned area. The VA pillar structure includes a substractively patterned metal layer. The VA pillar structure is a sub-lithographic contact. An MTJ stack is formed over the oxide layer and the metal layer of the VA pillar. A size of the MTJ stack and a shape anisotropy of the MTJ stack are independent of a size and a shape anisotropy of the sub-lithographic contact.

14 Claims, 6 Drawing Sheets

(56) References Cited

U.S. PATENT DOCUMENTS

| | | | |
|---|---|---|---|
| 2001/0038147 A1 | 11/2001 | Higashi et al. | 257/750 |
| 2003/0234182 A1 | 12/2003 | Andryushchenko | |
| 2004/0135184 A1* | 7/2004 | Motoyoshi | 257/295 |
| 2005/0207217 A1 | 9/2005 | Yates et al. | 365/158 |
| 2005/0277206 A1 | 12/2005 | Gaidis et al. | 438/3 |
| 2006/0148251 A1 | 7/2006 | Broekaart et al. | |
| 2006/0254053 A1 | 11/2006 | Chanda et al. | |
| 2008/0179699 A1* | 7/2008 | Horng et al. | 257/421 |

* cited by examiner

B > A    B < A

PILLAR-BASED INTERCONNECTS FOR MAGNETORESISTIVE RANDOM ACCESS MEMORY

CROSS-REFERENCE TO RELATED APPLICATION

This application is a divisional of and claims priority from U.S. patent application Ser. No. 12/549,799 filed on Aug. 28, 2009, now U.S. Pat. No. 8,796,041; the entire disclosure is herein incorporated by reference in its entirety.

BACKGROUND OF THE INVENTION

The present invention generally relates to the field of semiconductors, and more particularly relates to magneto-resistive random access memory comprising pillar interconnects and a method for fabricating the same.

Current integration of magneto-resistive random access memory ("MRAM") technology (based on toggle mode operation) requires precise control of dielectric planarity and a residue free surface to enable high fidelity magnetic performance across chip and across wafer. However, one such issue which has arisen when working towards achieving these requirements is that the fabrication of the via connecting the magnetics to the word line often results in significant amounts of residue which hinders device yield. The root cause of this problem has been traced to the chemical mechanical polishing steps of the Copper ("Cu) and tantalum ("Ta") via plug material, which results in residual slurry particles. Current processes that try to overcome this problem are usually limited by the material being polished. Furthermore, when scaling to potential spin torque structures, this integration places a greater dependence on magnetic shape anisotropy from patterning as a full stack etch is performed (as compared to the conventional SOA approach used in Toggle mode operation).

SUMMARY OF THE INVENTION

In one embodiment a semiconductor device is disclosed. The semiconductor device comprises a substrate including an M2 patterned area. A VA pillar structure is formed over the M2 patterned area. The VA pillar structure comprises a substractively patterned metal layer. The VA pillar structure is a sub-lithographic contact. An MTJ stack is formed over the oxide layer and the metal layer of the VA pillar. A size of the MTJ stack and a shape anisotropy of the MTJ stack are independent of a size and a shape anisotropy of the sub-lithographic contact.

In yet another embodiment, an integrated circuit is disclosed. The integrated circuit comprises a magnetic tunnel junction device. The MTJ device includes a substrate including an M2 patterned area. A VA pillar structure is formed over the M2 patterned area. The VA pillar structure comprises a substractively patterned metal layer. The VA pillar structure is a sub-lithographic contact. An MTJ stack is formed over the oxide layer and the metal layer of the VA pillar. A size of the MTJ stack and a shape anisotropy of the MTJ stack are independent of a size and a shape anisotropy of the sub-lithographic contact.

DETAILED DESCRIPTION

Figure 1:
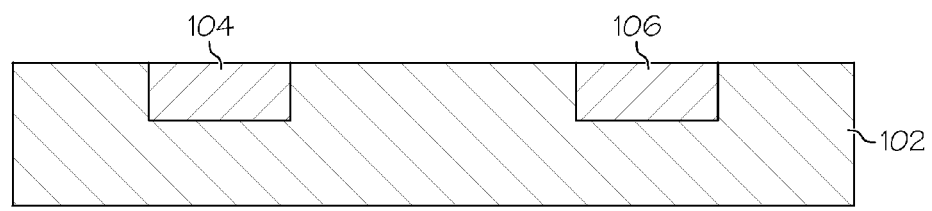
FIGS. 1-9 illustrate a process for fabricating a magnetic tunnel junction device according to one embodiment of the present invention.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

As discussed above, conventional fabrication techniques of MRAM devices generally result in a large number of defects due to the chemical mechanical polishing/planarization process ("CMP") used to polish down metal landing on a dielectric film. For example, based on the type of CMP slurry used to polish away metal, unwanted residue can remain after the CMP process has completed. With respect to MRAM devices, because slurry residue remains on the dielectric layer after the CMP process, the magnetic tunnel junction ("MTJ") of the MRAM device gets deposited around this defect, which hinders device yield.

The various embodiments of the present invention, on the other hand, produce MTJ devices such as MRAM structures with reduced CMP-based particle formation and that are more amenable to scaling. In one embodiment, a subtractive patterning of the word line VA via is used to achieve such results. Therefore, the various embodiments of the present invention, allow type of CMP slurry chemistry used for processing to be significantly modified; tune magnetic shape anisotropy independently from the patterning of the magnetic material itself; and scale the MRAM devices such that potential magnetic degradation during complete stack etch is avoided (at the edge regions of the device).

The various embodiments of the present invention also result in highly repeatable characteristics of MRAM devices by creating extremely smooth surfaces such that the magnetic layers are correctly pinned, which allows these layers to operate correctly. Therefore, in one embodiment, the polishing process at the VA level (via) generally does not have the same requirements as that of standard CMOS applications where copper is used at the back end line. For example, the various embodiments of the present invention utilize a subtractive metal etch, as compared to a damascene-based dielectric etch) to enable CMP with different slurry formulations that produce less residue.

Figure 2:
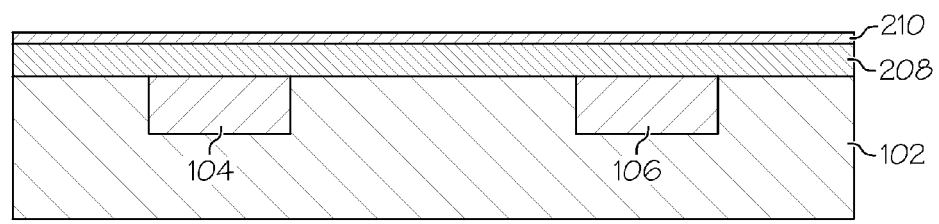

FIG. 1 shows a substrate 102, which can comprise silicon (Si). An M2 patterning process is performed to create one or more trench lines 104, 106 comprising, for example, copper wires. A metal layer 208 (e.g. conductive layer) such as a VA tantalum nitride ("TaN") layer is then deposited over the Si substrate 102 and the trench lines 104, 106, as shown in FIG. 2. It should be noted that the various embodiments of the present invention are not limited to TaN. For example, tantalum and other alloys can be used as well. The VA TaN layer 208 can be deposited using a physical vapor deposition ("PVD") method, a chemical vapor deposition method ("CVD"), or the like. Next, a hard mask layer 210 is deposited over the VA TaN layer 208, as shown in FIG. 2. The hard mask layer 210 (e.g., insulating layer) can comprise silicon nitride ("SiN"), SiN and a low temperature oxide ("LTO"), diamond like carbon, and the like.

Figure 4:
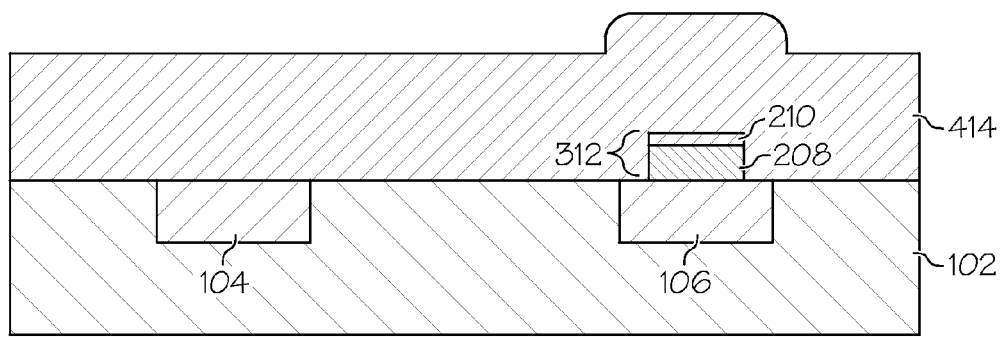

A subtractive patterning process is performed using lithography to form a VA (via level) pillar structure 312 comprising the metal layer 208 and the hard mask layer 210 on top of the M2 copper 104 at a desired location. In one embodiment, the pillar structure 312 is dimensioned such that the width of the pillar structure 312 is less than the width of the M2 copper 104. However, the present invention is not limited to such an embodiment. A high density plasma dielectric 414 such as a high quality oxide is then deposited over the substrate 102, the M2 copper 104, 106, and the VA pillar structure 312, as shown in FIG. 4.

Figure 5:
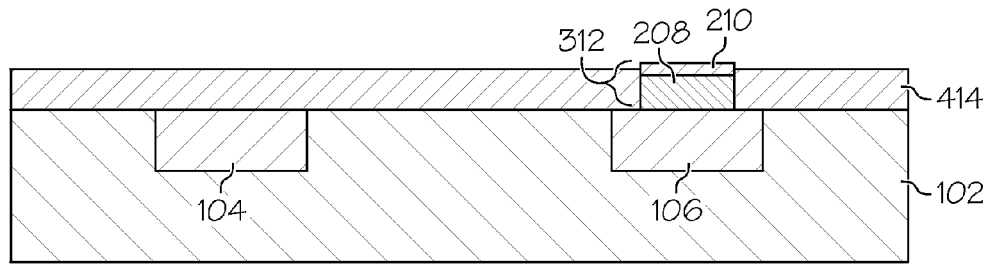
Figure 6:
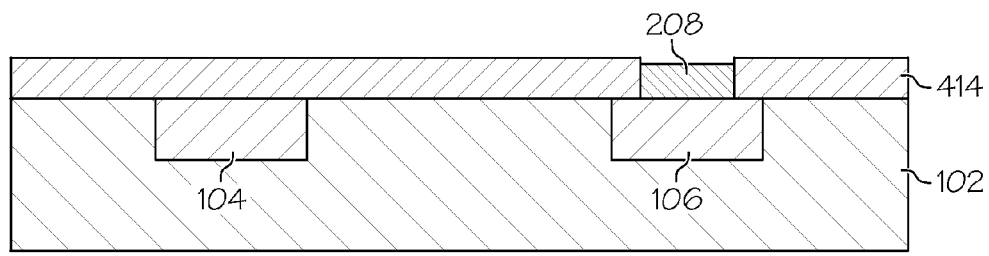
Figure 7:
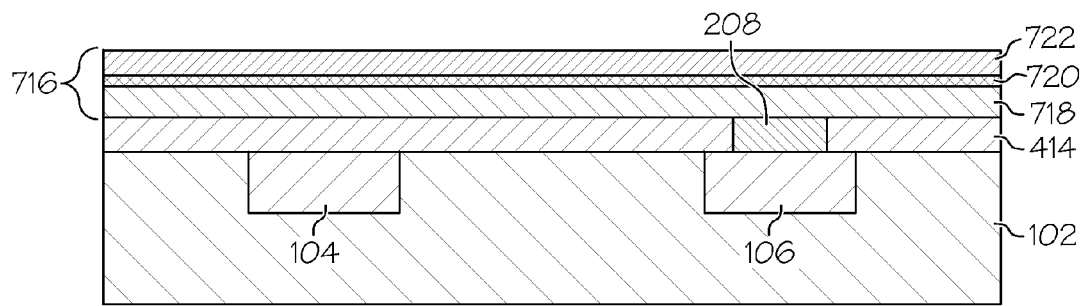

The high density plasma dielectric layer 414 is then polished back using a CMP process (or other similar process) to expose a portion of the hard mask layer 210 of the pillar structure 312, as shown in FIG. 5. Optionally, the hard mask layer 210 of the pillar structure 312 can then be removed using, for example, a 180° C. phosphorus process, as shown in FIG. 6. FIG. 7 shows that a magnetic tunnel junction stack 716 has been deposited over the high density plasma dielectric 414 and the VA TaN layer 208. In particular, an MA metal plate 718 or first magnetic layer is formed over the high density plasma dielectric 414 and the VA TaN layer 208. An insulating layer 720 is then deposited over the MA plate layer 718. A second magnetic layer 722 is then deposited over the insulating layer 720.

The MTJ stack 716 comprises two magnetic layers 718, 722 that are separated by an insulating layer 720 referred to as a tunnel barrier. One of the magnetic layers 718, 722 has a high level of magnetization and is fixed/pinned. The other magnetic layer 718, 722 has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

Figure 8:
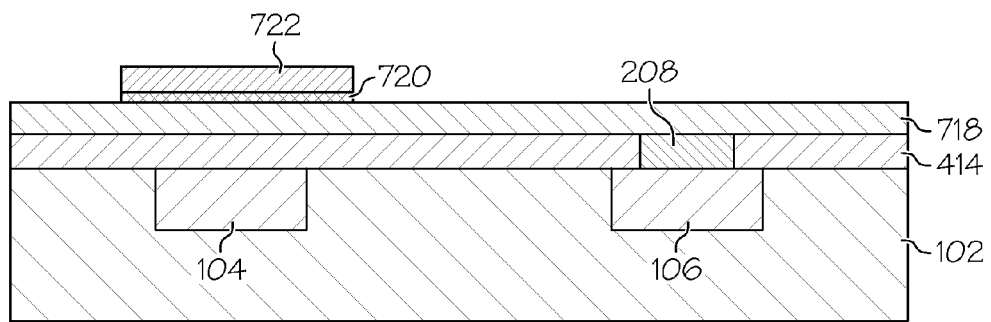
Figure 9:
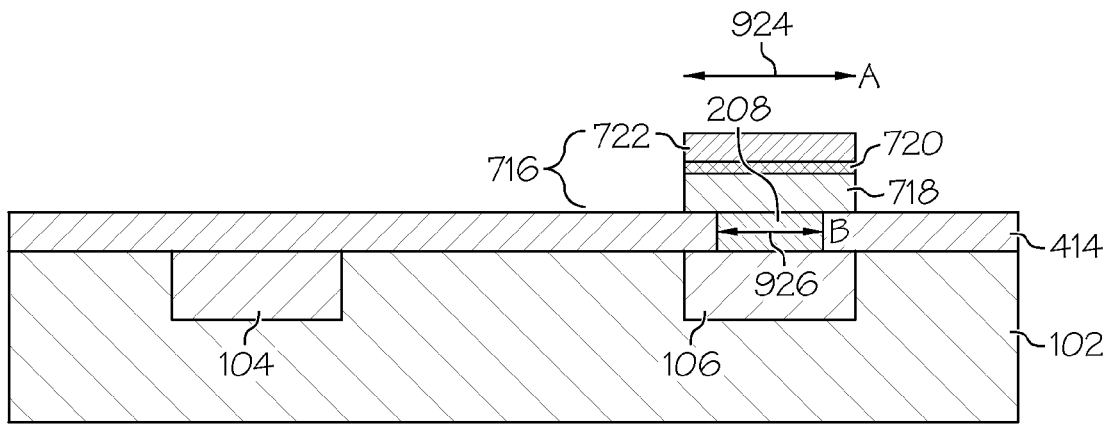

The MTJ stack is etched back using one or more etching processes such as reactive ion etching ("RIE") thereby exposing a portion of the MA plate 718, as shown in FIG. 8 or completely patterning all magnetic layers, as shown in FIG. 9. The MTJ etching process can be performed to adjust the MTJ size as indicated by the double headed arrow 924 and shape anisotropy independent of the size and shape anisotropy of the contact 208, as indicated by the double headed arrow 926. This provides an advantage over damascene structures because damascene structures are limited to cylindrical holes only and, thus, the shape anisotropy of the contact is fixed. It should be noted that the disparity in etch depth between FIGS. 8 and 9 is due to the type of MRAM technology being targeted. For field switching Toggle MRAM the MA plate 718 is needed. For Spin momentum transfer SMT-MRAM the MA plate 718 is not needed and the bottom metals are patterned along with the tunnel junction.

Being able to adjust the MTJ size and shape anisotropy of the MTJ stack 716 independent of the size and shape anisotropy of the contact 208 is important because shape anisotropy helps govern the switching between high resistance and low resistance states in MTJ devices. With the various embodiments of the present invention, current density can be controlled through the pillar structure as well as the shape anisotropy of the tunnel junction.

Figure 10:
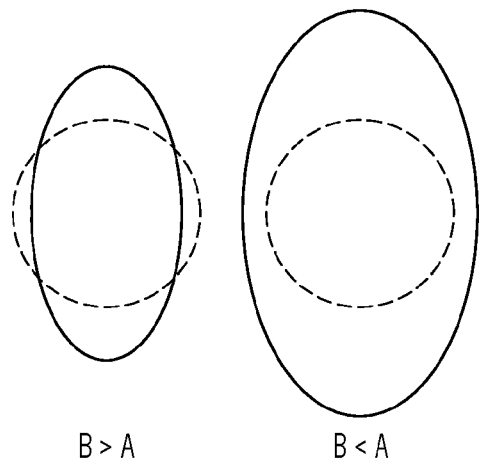
FIG. 10 shows magnetic tunnel junction and contact shape limitations using a damascene process.

FIG. 10 shows the limitations of conventional damascene methods, whereas FIGS. 11-15 show novel structures of the various embodiments of the present invention. It should be noted that with respect to FIGS. 10-15 the solid line figures correspond to the magnetic tunnel junction size (see reference number 924 of FIG. 9) and is referred to as "A" and the dashed line figures correspond to the contact (see reference number 210 of FIG. 10) and is referred to as "B". Also, the dashed lines are situated under the solid lines.

Figure 3:
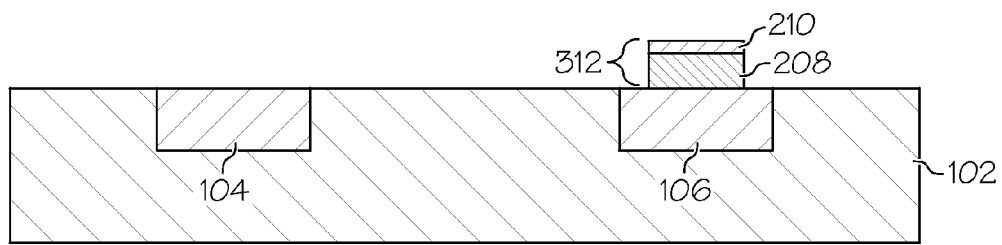

In particular, FIG. 10 shows that a damascene method is limited to a standard circular structure, e.g., circular holes. "A" can either be less than "B" or greater than "B" because the shape anisotropy of "B" is fixed. However, this limitation is eliminated by various embodiments of the present invention by substractively etching the contact to form the pillar structure discussed above with respect to FIG. 3 rather than filling it in with a damascene method an ellipsis can be formed in any given degree and/or direction as shown in v. In other words, "A" (i.e., the MTJ size) is flexible in shape and is independent of "B" (i.e., the contact 210).

Figure 11:
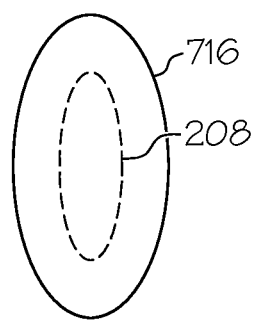
FIGS. 11-15 illustrate various magnetic tunnel junction and contact shapes and anisotropies according to one embodiment of the present invention.
Figure 12:
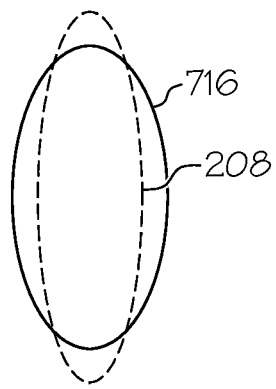
Figure 13:
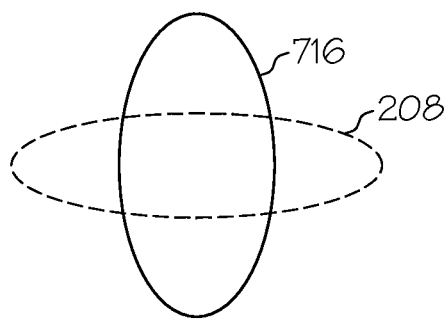
Figure 14:
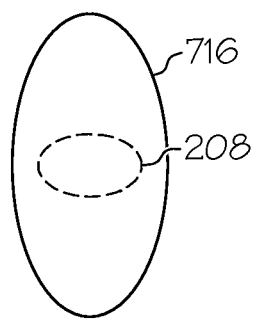
Figure 15:
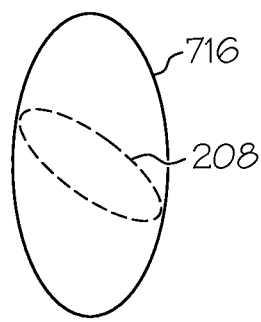

For example, FIG. 11 shows "A" and B" being parallel ellipses where "A" is greater than "B" and the ellipses are in the same direction. FIG. 12 shows A" and B" being parallel ellipses where "A" is smaller than "B" so that "B" is greater than "A" in any given direction. FIG. 13 shows "A" and "B" being ellipses oriented 90 degree from each other, where "A" and "B" can be substantially equal in size or one can be larger/smaller than the other. FIG. 14 shows "A" and "B" as ellipses and where "A" is larger than "B" in any given direction. FIG. 15 shows "A" and "B" as ellipses where "B" is oriented at a different angle than "A".

Being able to adjust the MTJ size and shape anisotropy of the MTJ stack 716 independent of the size and shape anisotropy of the contact 208 so that non-circular structures can be created enables the toggling of the magnetic layers 718, 722 or switching the magnetic layers 718, 722 between high/low resistive states. As discussed above, the high/low resistive states of a MTJ device can be controlled by creating parallel/anti-parallel magnetizations between the pinned magnetic layer and the free magnetic layer. Therefore, the structures of FIGS. 11-15 can be used to advantageously switch the magnetization of the free layer more readily. For example, with respect to the structures of FIGS. 14 and 15 since "B" is smaller than "A" a higher current density is created, which is more advantageous for spin torque type switching. The structures of FIGS. 12 and 13, where "B" is larger than "A", may be more advantageous for standard devices where switching magnetizations is not desired such as when measuring resistance.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A semiconductor device comprising:
   a semiconductor substrate comprising a conductive ("M2") patterned area, wherein a top surface of the M2 patterned are and a top surface of the semiconductor substrate are co-planar;
   a via level ("VA") pillar structure formed over and in contact with the M2 patterned area, wherein the VA pillar structure comprises a subtractively patterned metal layer, wherein the VA pillar structure is a sub-lithographic contact;
   an oxide layer formed over and in contact with at least the semiconductor substrate and adjacent to and in contact with the VA pillar structure, wherein a bottom surface of at least a first portion and a second portion of the oxide layer contacts a top surface of a first portion and a second portion of the M2 patterned area, respectively; and
   a magnetic tunnel junction ("MTJ") stack comprising a first magnetic layer, a second magnetic layer, and an insulating layer, wherein at least a portion of the first magnetic layer, the second magnetic layer, and the insulating layer each is formed directly over the metal layer of the VA pillar and the first and second portions of the oxide layer, and wherein the first magnetic layer contacts the metal layer of the VA pillar, where first and second portions of the first magnetic layer contact the first and second portions of the oxide layer, respectively,
   wherein a size of the MTJ stack and a shape anisotropy of the MTJ stack are independent of a size and a shape anisotropy of the sub-lithographic contact, and
   wherein a size of the MTJ stack corresponds to a size of the M2 patterned area.

2. The semiconductor device of claim 1, wherein the MTJ stack and the sub-lithographic contact are non-circular in shape.

3. The semiconductor device of claim 1, wherein the MTJ stack and the sub-lithographic contact are dimensioned substantially the same in at least one direction.

4. The semiconductor device of claim 1, wherein the sub-lithographic contact is dimensioned larger in at least one direction than the MTJ stack.

5. The semiconductor device of claim 1, wherein the sub-lithographic contact and the MTJ stack are oriented 90 degrees relative to each other.

6. The semiconductor device of claim 1, wherein the MTJ stack is dimensioned larger in at least one direction than the sub-lithographic contact.

7. The semiconductor device of claim 1, wherein a bottom surface of the M2 patterned area is free of contact with a bottom surface of the semiconductor substrate.

8. An integrated circuit comprising:
   a magnetic tunnel junction ("MTJ") device, wherein the MTJ device comprises:
      a semiconductor substrate comprising a conductive ("M2") patterned area, wherein a top surface of the M2 patterned are and a top surface of the semiconductor substrate are co-planar;
      a via level ("VA") pillar structure formed over and in contact with the M2 patterned area, wherein the VA pillar structure comprises a subtractively patterned metal layer, wherein the VA pillar structure is a sub-lithographic contact;
      an oxide layer formed over and in contact with at least the semiconductor substrate and adjacent to and in contact with the VA pillar structure, wherein a bottom surface of at least a first portion and a second portion of the oxide layer contacts a top surface of a first portion and a second portion of the M2 patterned area, respectively; and
      a MTJ stack comprising a first magnetic layer, a second magnetic layer, and an insulating layer, wherein at least a portion of the first magnetic layer, the second magnetic layer, and the insulating layer each is formed directly over the metal layer of the VA pillar and the first and second portions of the oxide layer, and wherein the first magnetic layer contacts the metal layer of the VA pillar, where first and second portions of the first magnetic layer contact the first and second portions of the oxide layer, respectively,
      wherein a size of the MTJ stack and a shape anisotropy of the MTJ stack are independent of a size and a shape anisotropy of the sub-lithographic contact, and
      wherein a size of the MTJ stack corresponds to a size of the M2 patterned area.

9. The integrated circuit of claim 8, wherein the MTJ stack and the sub-lithographic contact are non-circular in shape.

10. The integrated circuit of claim 8, wherein the MTJ stack and the sub-lithographic contact are dimensioned substantially the same in at least one direction.

11. The integrated circuit of claim 8, wherein the sub-lithographic contact is dimensioned larger in at least one direction than the MTJ stack.

12. The integrated circuit of claim 8, wherein the sub-lithographic contact and the MTJ stack are oriented 90 degrees relative to each other.

13. The integrated circuit of claim 8, wherein the MTJ stack is dimensioned larger in at least one direction than the sub-lithographic contact.

14. The integrated circuit of claim 8, wherein a bottom surface of the M2 patterned area is free of contact with a bottom surface of the semiconductor substrate.

* * * * *